United States Patent
Kato et al.

[11] Patent Number: 5,885,054
[45] Date of Patent: Mar. 23, 1999

[54] CARRYING DEVICE FOR SEMICONDUCTOR WAFERS

[75] Inventors: Hiroshi Kato; Kazuo Kuroda, both of Miyazaki, Japan

[73] Assignee: Komatsu Electronics Metals Co. Ltd., Hiratsuka, Japan

[21] Appl. No.: 791,579

[22] Filed: Jan. 31, 1997

[30] Foreign Application Priority Data

Jan. 31, 1996 [JP] Japan ................................. 8-050710

[51] Int. Cl.⁶ .................................................. B65G 49/07
[52] U.S. Cl. .......................... 414/783; 414/936; 414/941
[58] Field of Search .................................. 414/783, 936, 414/941; 294/1.1, 27.1, 32, 34, 902; 269/902

[56] References Cited

U.S. PATENT DOCUMENTS

| | | | |
|---|---|---|---|
| 4,682,928 | 7/1987 | Foulke et al. | 414/941 X |
| 4,770,600 | 9/1988 | Ishikawa | 414/783 |
| 4,971,512 | 11/1990 | Lee et al. | 414/941 X |
| 5,054,991 | 10/1991 | Kato | 414/783 |
| 5,188,501 | 2/1993 | Tomita et al. | 414/941 X |
| 5,566,466 | 10/1996 | Hearne | 414/936 X |
| 5,669,644 | 9/1997 | Kaihotsu et al. | 414/941 X |
| 5,669,752 | 9/1997 | Moon | 414/783 |

FOREIGN PATENT DOCUMENTS

| | | | |
|---|---|---|---|
| 2010753 | 1/1990 | Japan | 414/941 |
| 0034345 | 2/1991 | Japan | 414/936 |
| 4-0000749 | 1/1992 | Japan . | |
| 4062951 | 2/1992 | Japan | 414/941 |
| 4167541 | 6/1992 | Japan | 414/936 |

*Primary Examiner*—James W. Keenan
*Attorney, Agent, or Firm*—Varndell Legal Group

[57] ABSTRACT

The present invention provides a carrying device for semiconductor wafers. By using a simply constructed stage, the semiconductor wafers can be precisely positioned and rotating semiconductor wafers can be reliably supported and, only one kind of wafer stage needs to be provided for semiconductor wafers of different diameters, allowing more flexibility. The carrying device for loading a semiconductor wafer into a wafer carrier or taking the semiconductor wafer from the wafer carrier includes a carrier station for receiving wafer carrier, carrying arms for carrying semiconductor wafer, and a wafer stage for receiving the wafer. The wafer stage has a supporting shaft and four supporting arms. The supporting shaft is horizontally rotatable and is elevatable. Each supporting arm is upwardly curved.

14 Claims, 5 Drawing Sheets

FIG. 4
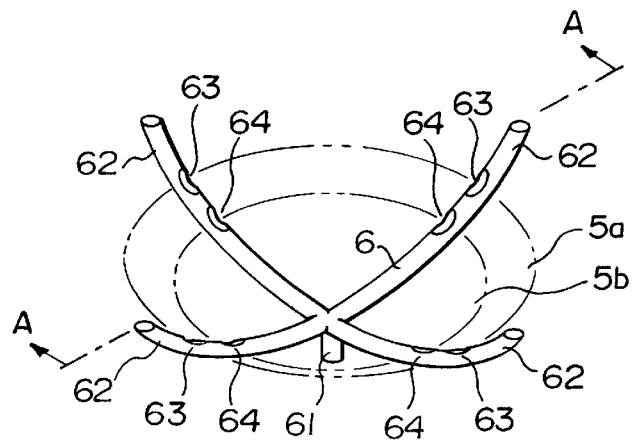
FIG. 5
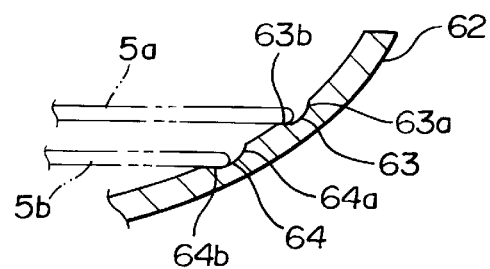
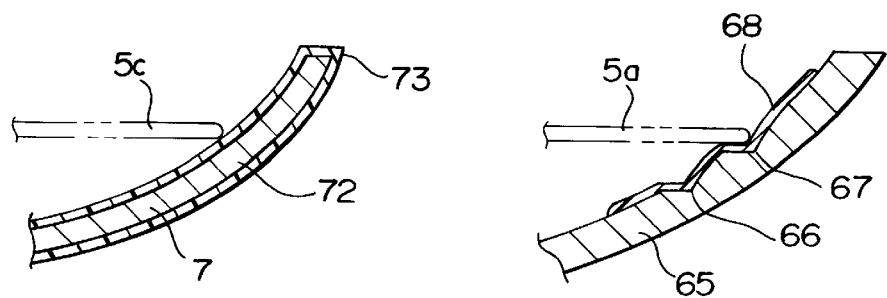
FIG. 6    FIG. 7

CARRYING DEVICE FOR SEMICONDUCTOR WAFERS

BACKGROUND OF THE INVENTION

1. Field of the Invention

The present invention relates to a carrying device for carrying semiconductor wafers from a wafer carrier to a sampling inspection device or loading the inspected semiconductor wafers into the wafer carrier.

2. Description of the Prior Art

Recently, in order to reduce labor expenses and increase throughput, surface inspection of processed wafers has been automated, and therefore many carrying devices for carrying wafers from a wafer carrier to a sampling inspection device or loading the inspected wafers into the wafer carrier have been developed. For example, as shown in FIG. 8, a prior art wafer carrying device consists of an elevatable carrier station 3a for receiving wafer carrier 30, a carrying arm 2a for a carrying semiconductor wafer 5, a horizontally rotatable wafer stage 8 for receiving the wafer 5 and a guide 9 mounted at the periphery of the wafer stage 8 for determining the position of the wafer 5. When the wafers 5 is to be placed on the wafer stage 8, the positioning of each wafer is then determined by the guide 9, and the wafer 5 is placed on a plurality of protrusions 81 which are provided on the periphery of the wafer stage 8.

However, if the wafer 5 loaded into the carrier 30 or the wafer 5 placed on the wafer stage 8 from other carrying devices (not shown) can not be positioned precisely, they will drop from the wafer stage 8.

In particular, the influence of inertia exists when a semiconductor wafer is not precisely positioned on the rotating wafer stage. As diameter of the semiconductor wafer is increased, the influence of inertia is larger. To improve this, in Japanese Patent Laid Open 7-273171, a "handling device for discal objects" is proposed. According to this device, by providing a centering guide shoe for positioning the semiconductor wafer and an sucking stand for sucking a bottom surface of a semiconductor wafer to a rotating stage, the rotating wafer is not moved and firmly supported.

However, according to the above-mentioned "handling device for discal objects", although the rotating semiconductor wafer can be firmly supported on the stage, the structure of the stage inevitably becomes complicated, and thus leading to such problems as the device is large and the fabrication cost is high.

Moreover, when carrying semiconductor wafers of different diameters, a change of different stages or the equipping of a plurality of carrying devices for carrying semiconductor wafers of different diameters is required in order to match with semiconductor wafers of different diameters.

SUMMARY OF THE INVENTION

In view of the above-mentioned problems, the object of the present invention is to provide a carrying device for semiconductor wafers, which uses a simply constructed stage. The carrying device of the invention, when receiving a semiconductor wafer, supports of rotating wafer more precisely. Further, with respect to semiconductor wafers of different diameters, it is only necessary to provide one kind of wafer stage in the carrying device of the invention, allowing more flexibility.

Accordingly, the carrying device of the invention for loading semiconductor wafer into a wafer carrier or taking a semiconductor wafer from the wafer carrier includes an elevatable carrier station for receiving the wafer carrier, a carrying arm for carrying the semiconductor wafer, and a horizontally rotatable wafer stage for receiving the wafer, wherein the wafer stage includes a horizontally rotatable and elevatable supporting shaft, and at least three supporting arms radially formed on the top end of the supporting shaft, each of which is upwardly formed, whereby when the wafer stage is elevated and rotated synchronously with the carrying arm, the carrying arm can receive and take up the semiconductor wafer on and from the wafer stage.

The carrying device for semiconductor wafers preferably includes four supporting arms, but the carrying device for semiconductor wafers of the present invention can include at least three supporting arms.

Preferably angles between adjacent arms of at least three supporting arms are substantially equal to each other.

Another object of the present invention is provide a carrying device for making the positioning of the semiconductor wafer.

According to an aspect of the invention, the carrying device of the invention includes an elevatable carrier station for receiving the wafer carrier, a carrying arm for a carrying semiconductor wafer, a horizontally rotatable wafer stage for receiving the wafer, and a sensor for sensing position of the orientation flat of the semiconductor wafer received in the wafer stage, wherein the wafer stage includes a horizontally rotatable and elevatable supporting shaft, and at least three supporting arms radially formed on the top end of the supporting shaft, each of which is upwardly formed, thereby when the wafer stage is elevated and rotated synchronously with the carrying arm, semiconductor wafer is loaded into the wafer carrier with the position of the orientation flat of each semiconductor wafer in a predetermined position.

The carrying device for semiconductor wafers preferably includes four supporting arms, but the carrying device for semiconductor wafers of the present invention can include at least three supporting arms.

Preferably angles between adjacent arms of at least three supporting arms are substantially equal to each other.

BRIEF DESCRIPTION OF THE DRAWINGS

The preferred embodiments of the invention will be described with reference to the accompanying drawings, in which:

FIG. 4 is a partial perspective view of the wafer stage of the carrying device according to the embodiment 1;

FIG. 5 is a partial enlarged section view of the wafer stage of FIG. 4 along the A—A line;

FIG. 6 is a partial elevational section view of the wafer stage of the carrying device according to the embodiment 2;

FIG. 7 is a partial elevational section view of the wafer stage of the carrying device according to the embodiment 3.

DESCRIPTION OF THE PREFERRED EMBODIMENTS

Figure 1:
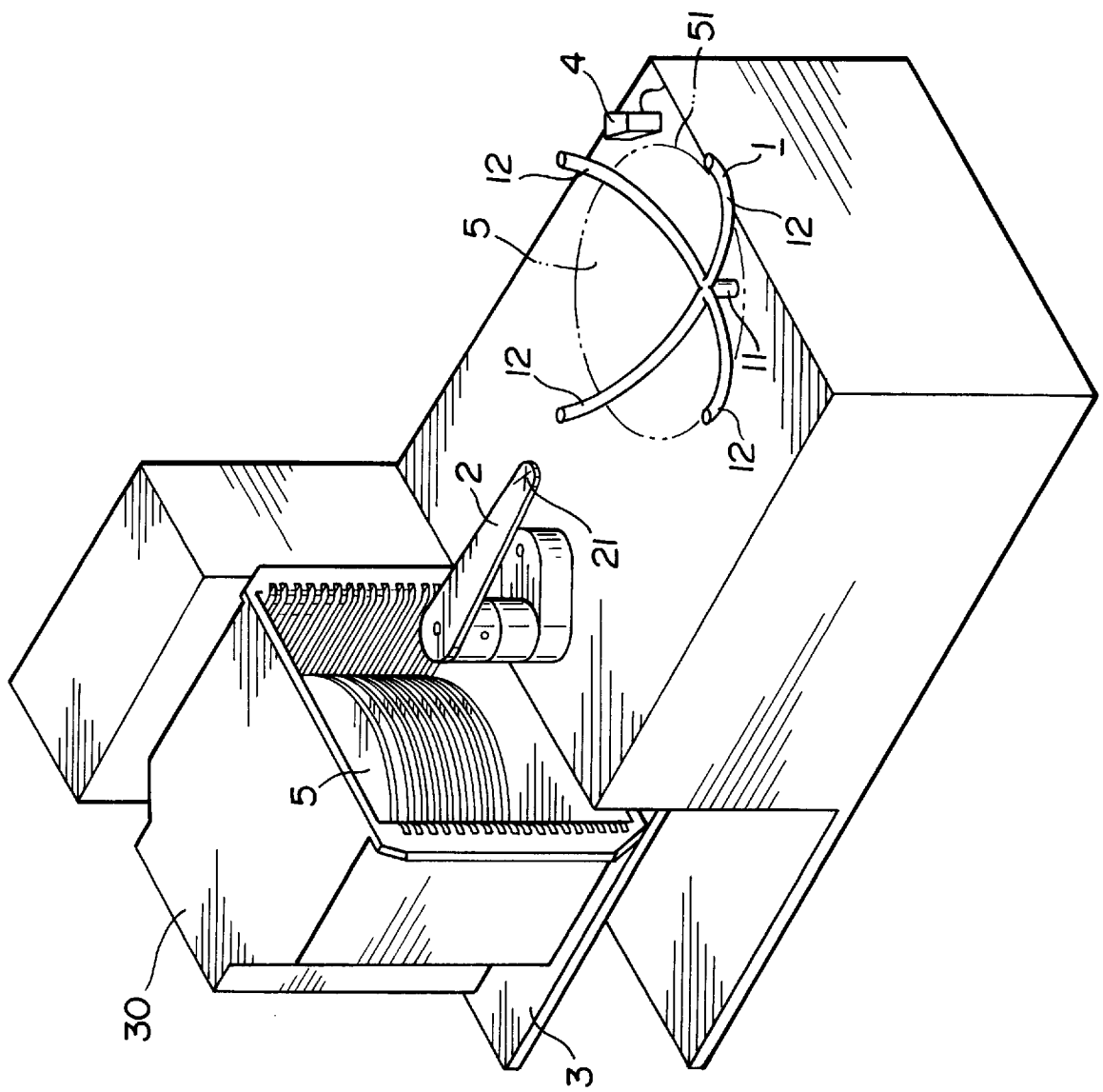
FIG. 1 is a perspective view of the carrying device for a semiconductor wafer according to the invention.

Referring to FIG. 1, the carrying device of the invention for loading a semiconductor wafer into a wafer carrier or taking the semiconductor wafer from the wafer carrier includes an elevatable carrier station 3 for receiving a wafer carrier 30, a stretchable carrying arm 2 for carrying semiconductor wafer 5, a horizontally rotatable wafer stage 1 for receiving wafer 5, and a sensor 4 for sensing the position of orientation flat of the semiconductor wafer 5 received in the wafer stage 1. Furthermore, at the tip of the carrying arm 2 is mounted a vacuum chuck 21 for sucking the bottom surface of the semiconductor wafer 5.

Figure 2:
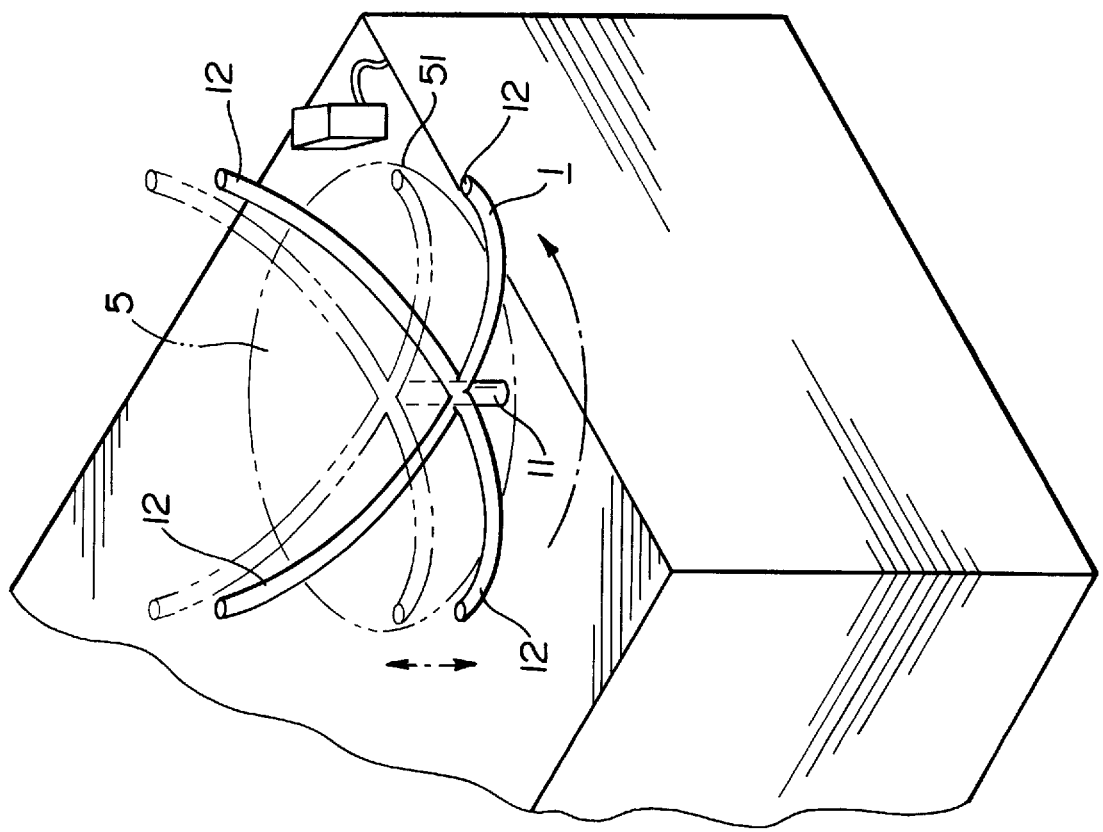
FIG. 2 is a partial perspective view of the wafer stage of the carrying device.

Referring to FIG. 2, the wafer stage 1 includes a horizontally rotatable and elevatable supporting shaft 11, and four supporting arms 12 radially formed on the top end of the supporting shaft 11, each of the supporting arms 12 is upwardly curved.

As shown in FIG. 1, a sensor 4 is mounted at the outside of the periphery of the rotating wafer stage 1 to detect the position of orientation flat 51 of semiconductor wafer 5 being rotated. When the position of the orientation flat 51 keeps its predetermined position, the rotation of the wafer 5 is stopped and semiconductor wafer 5 is taken up by the carrying arm 2 and loaded into the wafer carrier 30 so that every semiconductor wafer 5 is received in the wafer carrier 30 with its orientation flat 51 at the same direction.

The action of the wafer stage 1 and the carrying arm 2 is hereinafter described.

Figure 3A:
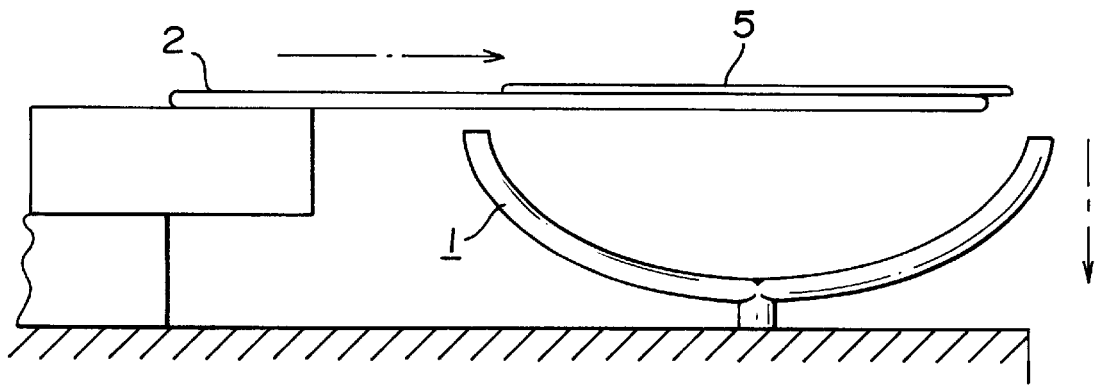
FIGS. 3a–3b are partial side views showing the actions of the wafer stage and carrying arm of the carrying device.
Figure 3B:
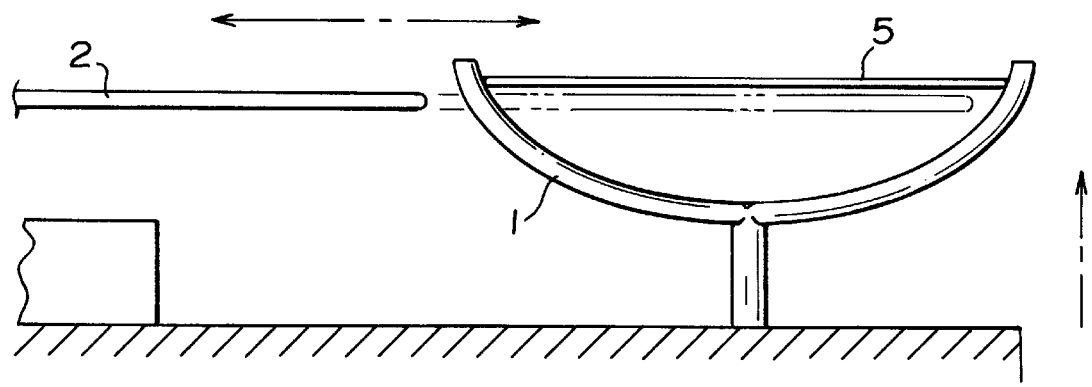
Figure 8:
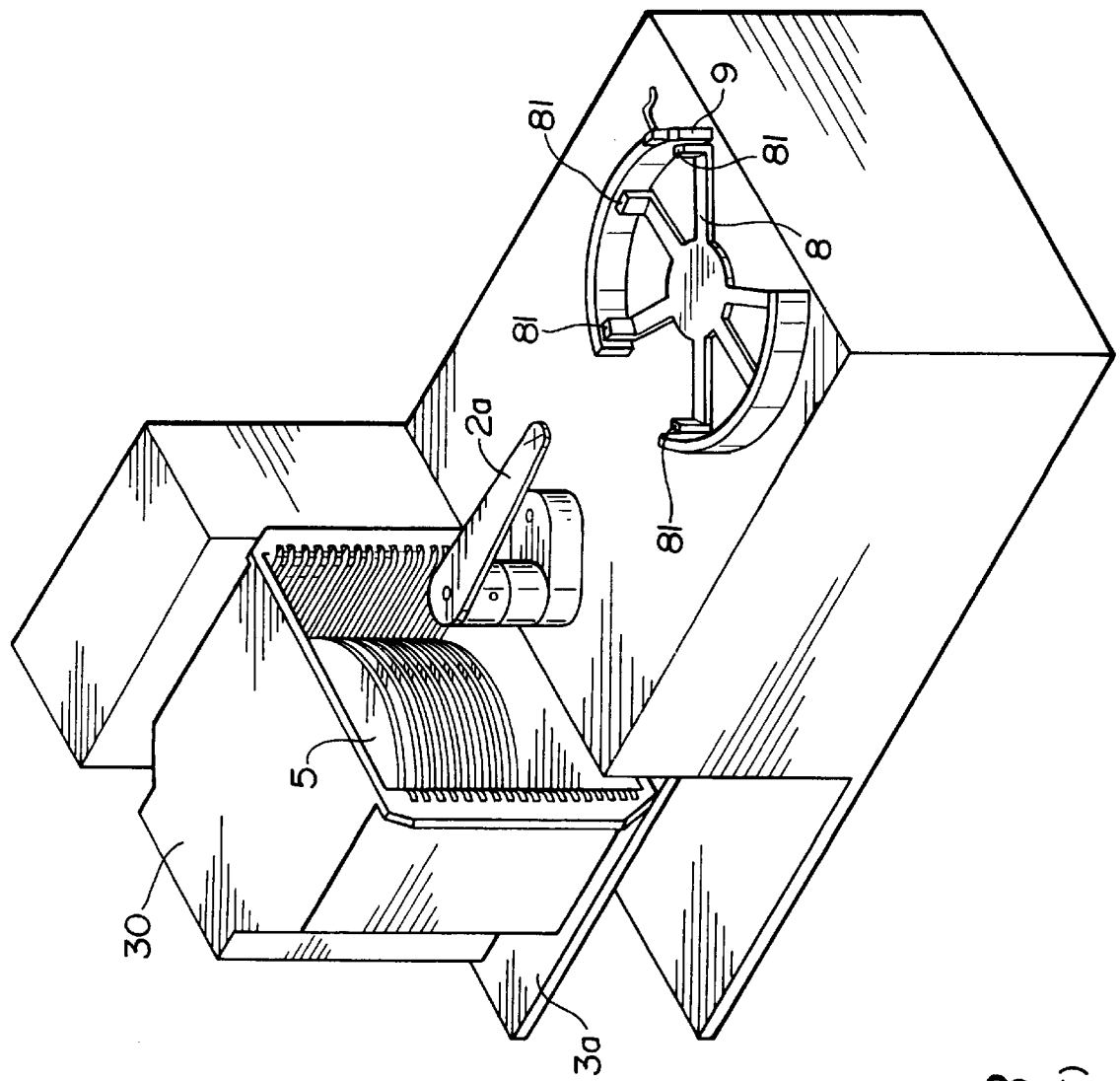
FIG. 8 is a perspective view of a prior art carrying device.

The wafer stage 1 is controlled to elevate and rotate so as to synchronize with the stretch and contraction of the carrying arm 2. That is, as shown in FIG. 3a, when the semiconductor wafer 5 is to be placed on the wafer stage 1, the carrying arm 2 is stretched and subsequently moved to be placed above the wafer stage 1. As shown in FIG. 3b, by elevating the wafer stage 1, the peripheral part of the semiconductor wafer 5 is in contact with the central upper part of each supporting arm 12 and concurrently the semiconductor wafer 5 is sucked by a vacuum chuck 21 (see FIG. 1) and stopped, and thus the semiconductor wafer 5 is placed on the wafer stage 1.

Further, when the semiconductor wafer 5 is to be taken up from the wafer stage 1, as shown in FIG. 3b, the after wafer stage 1 is elevated, the carrying arm 2 stretches and enters the bottom surface of the semiconductor wafer 5, and then, as shown in FIG. 3a, the wafer stage 1 is lowered to bring the bottom surface of the semiconductor wafer 5 into contact with the carrying arm 2. Concurrently, the vacuum chuck 21 (see FIG. 1) sucks the semiconductor wafers 5 and thus the semiconductor wafer 5 is taken up from the wafer stage 1.

Accordingly, as shown in FIG. 2, the peripheral part of the semiconductor wafer 5 received in the wafer stage 1 is in contact with each central upper part of the supporting arm 12 so that the semiconductor wafer 5 is reliably supported on the wafer stage 1 at four points. Moreover, even when the semiconductor wafer 5 is rotated with the supporting arm 12, as it is supported on the supporting arms 12 from four directions, it will not be moved horizontally by the inertia of rotation.

Further, even when the position of the orientation flat 51 faces one of the supporting arms 12, the semiconductor wafer 5 can be supported by other three supporting arms 5.

The embodiments of the invention are hereinafter described with reference to the drawings.

Embodiment 1

FIG. 4 is a partial perspective view of the wafer stage of the carrying device according to embodiment 1 and FIG. 5 is a partial enlarged section view of the wafer stage along the A—A line.

As shown in FIG. 4, wafer stage 6 of carrying device of embodiment 1 includes a supporting shaft 61 and four supporting arms 62, and is designed to be capable of receiving semiconductor wafers 5a, 5b of different diameters. Angles between adjacent arms of four supporting arms 62 are equal to each other.

At the contacting portion of each supporting arm 62 with the semiconductor wafers 5a and 5b, recessed portions 63 and 64 are formed.

As shown in FIG. 5, recessed portions 63 and 64 include slightly outward-inclined peripheral surfaces 63a and 64a as well as substantially horizontal receiving surfaces 63b and 64b so that the outer rims of semiconductor wafers 5a and 5b can be easily placed. Accordingly, even when semiconductor wafers 5a and 5b are not precisely placed, they can be positioned precisely by the recessed portions 63 and 64.

Embodiment 2

FIG. 6 is a partial elevational section view of the wafer stage of the carrying device according to embodiment 2.

As shown in FIG. 6, the surface of the supporting arm 72 of the wafer stage 7 of the carrying device of embodiment 2 is covered with a cover 73 which is made of elastic resin. With this cover 73, when semiconductor wafer 5c is placed on wafer stage 7, the impact on the contacted surface can be reduced.

Embodiment 3

FIG. 7 is a partial elevational section view of the wafer stage of the carrying device according to embodiment 3.

As shown in FIG. 7, wafer stage 65 of embodiment 3 is provided with recessed portions 66 and 67 as wafer stage 6 of embodiment 1, and their peripheral portions are coated with resin. When semiconductor wafer 5a is placed, even if it is not positioned precisely, since the coating surface 68 is slippery, the semiconductor wafer 5a can be precisely positioned.

Furthermore, in view of the elasticity and to prevent contamination to semiconductor wafers, the materials of the cover 73 and coating surface 68 are preferably made of resin such as polytetrafluroethylene and polytriflurochloroethylene.

The carrying device for semiconductor wafers of these embodiments includes four supporting arms, but the carrying device for semiconductor wafers of the present invention can includes at least three supporting arms.

Preferably angles between adjacent arms of at least three supporting arms are substantially equal to each other.

The present invention constructed as above has the following advantages due to its simple construction.

(1) Before semiconductor wafer is placed on the wafer stage, even if it is not precisely positioned, wafer dropping troubles can be avoided.

(2) The wafer can be precisely positioned on the wafer stage.

(3) Rotating semiconductor wafer can be reliably supported so that slipping and dropping of semiconductor wafers can be prevented.

(4) Because the semiconductor on the wafer stage contacts with the supporting arm radially formed on the top end of said supporting shaft at points, even when one kind of wafer stage is sufficient for semiconductor wafers of different diameters, and thus is more flexible.

What is claimed is:

1. A carrying device for loading semiconductor wafers into a semiconductor wafer carrier or removing the semiconductor wafers from the semiconductor wafer carrier, which comprises an elevatable carrier station for receiving the semiconductor wafers, a carrying arm for carrying the semiconductor wafers, and a wafer stage for receiving the semiconductor wafers, the wafer stage including a horizontally rotatable and elevatable supporting shaft, the supporting shaft having a top end and at least three supporting arms radially formed on the top end of the supporting shaft, the supporting arms extending upward, wherein the carrying arm and the wafer stage have means cooperating with each other for holding a respective semiconductor wafer, transporting the respective semiconductor wafer to the wafer stage and positioning the respective semiconductor wafer above the wafer stage; and then for elevating the supporting shaft of the wafer stage, for contacting and holding the respective semiconductor wafer with the supporting arms; and then for releasing the respective semiconductor wafer by the carrying arms and for retracting the carrying arm away from the wafer stage.

2. The carrying device as claimed in claim 1, wherein angles between adjacent arms of the at least three supporting arms are substantially equal to each other.

3. The carrying device as claimed in claim 1, wherein a surface of the supporting arms has a cover made of elastic resin.

4. A carrying device for loading semiconductor wafers into a semiconductor wafer carrier or removing the semiconductor wafers from the semiconductor wafer carrier, which comprises an elevatable carrier station for receiving the semiconductor wafers, a carrying arm for carrying the semiconductor wafers, and a wafer stage for receiving the semiconductor wafers, the wafer stage including a horizontally rotatable and elevatable supporting shaft, the supporting shaft having a top end and at least three supporting arms radially formed on the top end of the supporting shaft, the supporting arms extending upward, each of the supporting arms including a recessed portion for contacting a peripheral portion of semiconductor wafers of varying sizes, the recessed portion of each supporting arm being located a same distance from a center of the supporting shaft, for a semiconductor wafer of a particular size, and the recessed portions having an outward-inclined peripheral surface and a substantially horizontal receiving surface, wherein the carrying arm and the wafer stage have means cooperating with each other for holding a respective semiconductor wafer, transporting the respective semiconductor wafer to the wafer stage and positioning the respective semiconductor wafer above the wafer stage; and then for elevating the supporting shaft of the wafer stage, for contacting and holding the respective semiconductor wafer with the supporting arms; and then for releasing the respective semiconductor wafer by the carrying arms and for retracting the carrying arm away from the wafer stage.

5. The carrying device as claimed in claim 4, wherein each of the supporting arms is provided with a plurality of recessed portions corresponding to different diameters of the semiconductor wafers.

6. The carrying device as claimed in claim 5, wherein at least the recessed portions of the supporting arms are coated with resin.

7. The carrying device as claimed in claim 4, wherein at least the recessed portions of the supporting arms are coated with resin.

8. A carrying device for semiconductor wafers which comprises an elevatable carrier station for receiving the semiconductor wafers, a carrying arm for carrying the semiconductor wafers, a wafer stage for receiving the semiconductor wafers, and a sensor for detecting a position of an orientation flat of the semiconductor wafers, the wafer stage including a horizontally rotatable and elevatable supporting shaft, the supporting shaft having a top end and at least three supporting arms radially formed on the top end of the supporting shaft, the supporting arms extending upward, wherein the carrying arm and the wafer stage have means cooperating with each other for holding a respective semiconductor wafer, transporting the respective semiconductor wafer to the wafer stage and positioning the respective semiconductor wafer above the wafer stage; and then for elevating the supporting shaft of the wafer stage, for contacting and holding the respective semiconductor wafer with the supporting arms; and then for releasing the respective semiconductor wafer by the carrying arms and for retracting the carrying arm away from the wafer stage.

9. The carrying device as claimed in claim 8, wherein angles between adjacent arms of the at least three supporting arms are substantially equal to each other.

10. The carrying device as claimed in claim 8, wherein a surface of the supporting arms has a cover made of elastic resin.

11. The carrying device as claimed in claim 8, wherein each of the supporting arms include a recessed portion for contacting a peripheral portion of the semiconductor wafers, all the recessed portions for a semiconductor wafer of one size are located a same distance from a center of the supporting shaft, and the recessed portions have an outward-inclined peripheral surface and a substantially horizontal receiving surface.

12. The carrying device as claimed in claim 11, wherein each of the supporting arms is provided with a plurality of recessed portions corresponding to different diameters of the semiconductor wafers.

13. The carrying device as claimed in claim 12, wherein at least the recessed portions of the supporting arms are coated with resin.

14. The carrying device as claimed in claim 11, wherein at least the recessed portions of the supporting arms are coated with resin.

* * * * *